(12) United States Patent
Kenney et al.

(10) Patent No.: US 6,834,087 B2
(45) Date of Patent: Dec. 21, 2004

(54) DELAY LOCK LOOP CIRCUIT, AND ASSOCIATED METHOD, FOR A RADIO RECEIVER

(75) Inventors: Thomas J. Kenney, San Diego, CA (US); Jukka Tapaninen, San Diego, CA (US)

(73) Assignee: Nokia Corporation, Espoo (FI)

( * ) Notice: Subject to any disclaimer, the term of this patent is extended or adjusted under 35 U.S.C. 154(b) by 105 days.

(21) Appl. No.: 10/356,375

(22) Filed: Jan. 31, 2003

(65) Prior Publication Data

US 2004/0151272 A1 Aug. 5, 2004

(51) Int. Cl.[7] .............................................. H03K 9/00
(52) U.S. Cl. ....................................................... 375/316
(58) Field of Search ................................. 375/316, 354, 375/373, 374, 327; 329/325

(56) References Cited

U.S. PATENT DOCUMENTS 6,463,091 B1 * 10/2002 Zhodzicshsky et al. ...... 375/149
6,525,615 B1 *  2/2003 Masenas et al. .............. 331/34

* cited by examiner

*Primary Examiner*—Khai Tran

(57) ABSTRACT

A delay lock loop (DLL) circuit, and an associated method, for a receiver. The delay lock loop circuit is selectably operable in an acquisition mode and a tracking mode. A selector selects operating parameters of elements of the delay lock loop circuit to cause operation of the circuit alternately in the acquisition mode and the tracking mode. Through appropriate selection of the operating parameters, a selected one of the operating modes is effectuated. The delay lock loop circuit is amplitude-independent, operable irrespective of the values of the input signals applied thereto.

20 Claims, 2 Drawing Sheets

DELAY LOCK LOOP CIRCUIT, AND ASSOCIATED METHOD, FOR A RADIO RECEIVER

The present invention relates generally to a manner by which to synchronize a receiver to a transmitter operable in a radio communication system, such as a cellular communication system that utilizes a spread-spectrum communication scheme. More particularly, the present invention relates to a delay lock loop (DLL) circuit, and an associated method, that synchronizes the receiver to a signal transmitted to the receiver by the transmitter.

The DLL circuit is configurable alternately to be operated in an acquisition mode and a tracking mode. And, the delay lock loop circuit is operable irrespective of the amplitude of an input signal applied thereto. That is to say, the delay lock loop circuit is amplitude-independent. And, the circuit operates in a deterministic manner, irrespective of the signal levels of input signals applied thereto. Circuit-design compromises required in conventional delay lock loop circuits, due to the amplitude sensitivity of such conventional circuits are not required, thereby permitting simplified circuitry that does not require input-signal normalization for operation of the delay lock loop circuit.

BACKGROUND OF THE INVENTION

A communication system operates to communicate data between two or more locations at which communication stations, operable in the communication system, are positioned. Data, sourced at a sending station, is communicated upon a communication channel to be terminated at a receiving station.

Many varied types of communication systems have been developed and communication of data through the use of such communication systems is a pervasive aspect of modern society. And, the need to communicate data shall likely become increasingly pervasive in the future.

Advancements in communication technologies are implemented into existing communication systems to improve their performance. And, advancements in communication technologies have permitted the implementation of new types of communication systems that provide for new types of communication services, previously unavailable.

A radio communication system is an exemplary communication system and is exemplary of a type of communication system in which advancements in communication technologies have been implemented. New types of communication services, and effectuation of conventional communication services in improved manners, are possible as a result of implementation of such advancements in communication technologies.

Communication channels defined in a radio communication system are defined upon radio links that extend between the communication stations of the radio communication system. The need to utilize a conventional, wireline connection along the entire communication path extending between sending and receiving stations of the communication system is obviated. For at least a portion of the communication path, a radio link is substituted for the wireline connection. And, when the radio link is substituted for the wireline connection, the need otherwise to utilize a wireline connection along that portion of the communication path is obviated.

A radio communication system provides various advantages. Initial installation and initial deployment of a radio communication system is performed generally in a less costly manner than the corresponding costs required to install and deploy a wireline counterpart. Also, a radio communication system is permitting of implementation as a mobile communication system. In a mobile communication system, one or more of the communication stations operable therein is mobile, i.e., is permitted movement.

A cellular communication system is a type of mobile communication system. Cellular communication systems have achieved high levels of usage and the network infrastructures of cellular communication systems have been installed to encompass significant portions of the populated areas of the world. Voice, and other data, services are effectuated through the use of a cellular communication system.

A cellular communication system is constructed, generally, to be in conformity with a standard, operational specification promulgated by a standards-creating body, such as the EIA/TIA. Successive generations of communication standards have been promulgated, and communication systems have been implemented to be in operational conformity therewith. First-generation, second-generation, third-generation, and successor-generation operational specifications have been promulgated or are under discussion.

Several of the operational specifications set forth CDMA (code-division, multiple-access) communication schemes, utilizing spread-spectrum communication techniques. The IS-95, IS-98, and IS-2000 operational specifications set forth the operational parameters of communication systems that utilize CDMA communication schemes. Other operational specifications set forth the operating parameters of communication systems that utilize other communication schemes, such as TDMA (time-division, multiple-access) schemes or conventional analog communication schemes.

Communication stations operable in a cellular communication system pursuant to a communication session must be in synchronization with one another so that the data that is communicated therebetween is successfully received. A delay lock loop circuit, forming part of a receiver, is sometimes used by which to place, and maintain, the receiver in synchronization with the transmitter. Such circuits are used in spread-spectrum systems as well as other cellular, and other radio, communication systems. Delay lock loop circuits, for instance, are used in communication systems operable pursuant to an IEEE 802.11 standard, the aforementioned IS-95/IS-2000 standards, and a WCDMA standard. In an IS-95/IS-2000 system, the receiver utilizes a pilot signal broadcast during operation of such a communication system, to place the receiver in synchronization with a transmitter.

A delay lock loop circuit generally has two operating modes. A first mode, referred to as an acquisition mode, is first used during initial synchronization when the initial timing between the transmitter and receiver is only coarsely known. In this mode, the delay lock loop circuit attempts to align the receiver and transmitter in a quick manner. Thereafter, a second mode, referred to as a tracking mode, is used. In the tracking mode, the timing of the receiver is close to the correct timing epoch. And, when in the tracking mode, the delay lock loop further reduces timing errors between the receiver and transmitter.

When in the acquisition mode, the timing error is maintained with some known variance, which is dependent upon loop parameters. The amount of variance is traded-off against a desired pull-in time. When in the tracking mode, there no longer is a pull-in requirement, and the loop bandwidth of the delay lock loop circuit is changed in order to provide a tracking error that exhibits a smaller variance.

Conventionally, the architecture of the delay lock loop circuit used for the acquisition mode and the delay lock loop circuit used for the tracking mode use different loop filters.

Conventional delay lock loop circuits, however, are input signal-dependent. That is to say, the delay lock loop circuit is inherently dependent upon the input signal level of input signals applied thereto. And, thus, the circuit is constructed to be capable to receive a range of input signal levels, and circuit-construction compromises are made at other signal levels. Normalization of input signal values is sometimes required and, when the input signal is beyond the accepted range of input signal levels, the delay lock loop circuit might not perform acceptably.

Therefore, an improved manner by which to place, and maintain, a receiver in synchronization with a transmitter is required.

It is light of this background information related to delay lock loop circuits that the significant improvements of the present invention have evolved.

SUMMARY OF THE INVENTION

The present invention, accordingly, advantageously provides apparatus, and an associated method, by which to synchronize a receiver to a transmitter operable in a radio communication system, such as a cellular communication system that utilizes a spread-spectrum communication scheme.

Through operation of an embodiment of the present invention, a manner is provided for the receiver that synchronizes the receiver to a signal transmitted to the receiver by the transmitter.

In one aspect of the present invention, a delay lock loop (DLL) circuit is alternately configured to be operated in an acquisition mode and in a tracking mode. The same circuit elements are used irrespective in which of the modes that the delay lock loop circuit is operated.

In another aspect of the present invention, a delay lock loop circuit is provided that is amplitude-independent of an input signal applied thereto. The delay lock loop circuit operates in a deterministic manner to synchronize a receiver to place, and maintain, the receiver in synchronization with a transmitter that transmits a receive signal to the receiver. Irrespective of the signal levels of the receive signal, and the input signal representative thereof, applied to the delay lock loop circuit, the delay lock loop circuit is able to make use of the input signal to perform synchronization operations. Input signal normalization is not required for operation of the delay lock loop circuit, and simplified circuit construction of the delay lock loop circuit is permitted.

In another aspect of the present invention, a sampled representation of an input signal applied to the delay lock loop circuit is utilized to form a feedback signal that alters subsequent operation of a sample generator. Mathematical difference values are formed of symbol values, delayed by positive and negative time offsets. The values of the mathematical differences are integrated over a selected period, down-sampled, hard-limited, and filtered. Filtering of the hard-limited values is effectuated by a filter that exhibits a filter transfer function and is of a selected bandwidth.

Sampled symbol values of zero offsets are filtered by a filter that exhibits a filter transfer function and a filter bandwidth. Once filtered, the sampled symbol values of the zero offsets are used to phase-correct the sampled symbol values of the positive and negative offsets.

The sampled symbol values of the zero offset, the positive offset, and the negative offset are integrated over selected sample periods.

In another aspect of the present invention, a selector operates to select values of selectable parameters of circuit elements of the delay lock loop circuit. The selection of the parameters is dependent upon in which operational mode that the delay lock loop circuit is operated. When in the acquisition mode, the selector selects a first set of parameters by which the circuit elements of the delay lock loop circuit are caused to be operated. And, when in the tracking mode, the selector causes a second set of parameters to be used by which to operate the circuit elements of the delay lock loop circuit. Through suitable selection of the parameter values of the circuit elements, the delay lock loop circuit is caused to operate in either the acquisition mode or the tracking mode. And, the delay lock loop circuit is able to act upon input signals of any amplitude. Normalization of the input signal is not required, and, additionally, circuit simplification is provided.

In these and other aspects, therefore, a delay lock loop circuit, and an associated method, is provided for a receiver. The receiver is operable to receive a receive signal transmitted thereto during operation of a radio communication system. Synchronization of the receiver with the receive signal transmitted thereto is provided. A sample selection signal generator is adapted to receive sampled representations of the receive signal. The sample selection signal generator generates a sample-selection signal. The sample-selection signal is calculated over a selected sampling period. The sample-selection signal is of a value responsive to the sampled representations of the receive signal over selected sample period lengths. Each sampled representation is represented in terms of a positive offset, a negative offset, and a zero offset. A selector is coupled to the sampled selection signal generator. The selector selects operation of the sample selection signal generator, alternately in a first a mode and in at least a second mode. When operation in the first mode is selected, the selector selects the selected sampling period to be of first sample period lengths. And, when operation in the second mode is selected, the selector selects the selected sampling period to be of second sample period lengths.

A more complete appreciation of the present invention and the scope thereof can be obtained from the accompanying drawings that are briefly summarized below, the following detailed description of the presently-preferred embodiments of the invention, and the appended claims.

DETAILED DESCRIPTION

Figure 1:
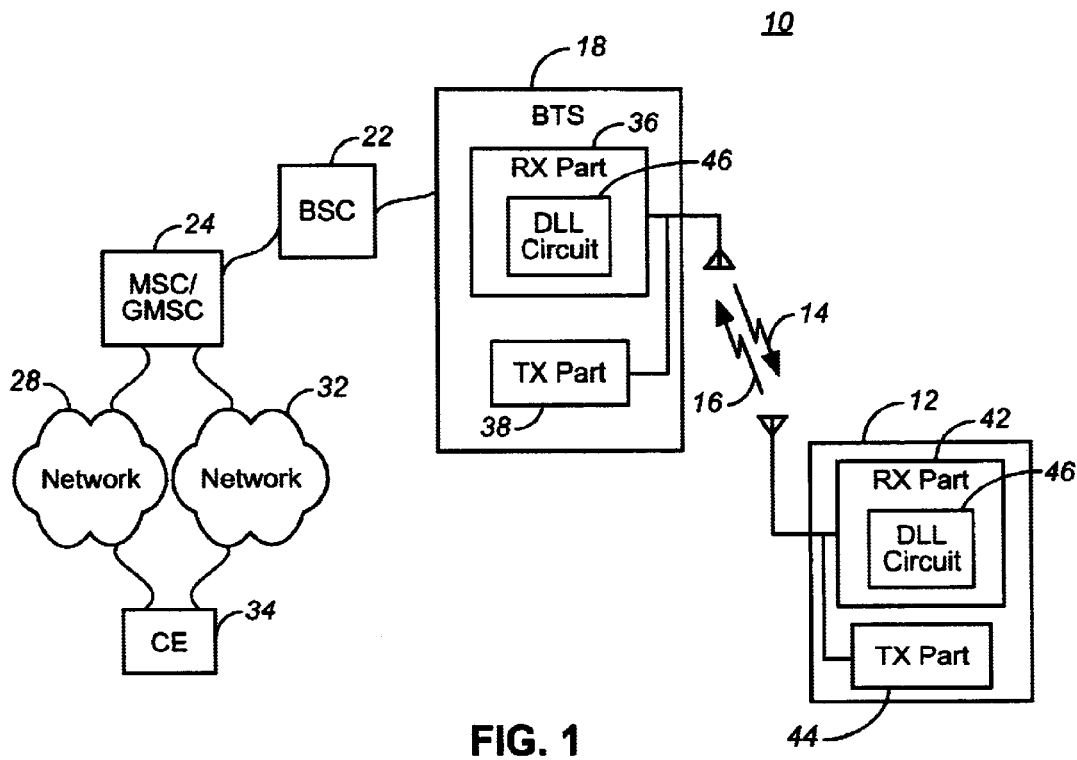
FIG. 1 illustrates a functional block diagram of a radio communication system in which an embodiment of the present invention is operable.

Referring first to FIG. 1, a communication system, shown generally at 10, provides for communications between a fixed network and mobile stations. The mobile station 12 is representative of the mobile stations with which communications are effectuated with the fixed network. The communication system 10, in the exemplary implementation, forms a cellular communication system, operable pursuant to a spread-spectrum communication scheme, such as a communication scheme defined in the IS-95/IS-2000 operational specifications promulgated by an appropriate standards-creating body. While the following description shall describe operation of the communication system 10 with respect to its exemplary implementation as a communication system that operates pursuant to a spread-spectrum communication scheme, the teachings of the present invention are also implementable in other radio, as well as other, communication systems that utilize delay lock loops to synchronize communication stations of a communication system.

Communications between the mobile station and the fixed network of the communication system are effectuated by way of radio channels defined upon radio links formed between the mobile station and the fixed network. Here, forward links 14 and reverse links 16 are shown. Data that is communicated to the mobile station 12 is communicated upon radio channels, referred to as forward link channels, defined upon the forward link 14. And, data communicated by the mobile station to the fixed network is communicated upon radio channels, referred to as reverse link channels, defined upon the reverse link 16. Two-way communication of data between the mobile station and the fixed network is provided through the communication of data upon the forward link and reverse link channels.

The fixed network of the communication system includes a radio access network (RAN) part, here shown to include a base transceiver station (BTS) 18. The base transceiver station transceives data-containing communication signals, i.e., the data, upon the radio channels defined upon the forward links and reverse links 16.

The base transceiver station, in turn, is coupled to a base station controller (BSC) 22. While not shown in the Figure, typically, a group of base transceiver stations is associated with, and coupled to, a single base station controller. The base transceiver station 18 shown in the Figure is representative of one of such base transceiver stations. The base station controller, in turn, is coupled to a mobile switching center/gateway mobile switching center (MSC/GMSC) 24. Also, while not separately shown, groups of base station controllers are analogously also coupled to the switching center. The switching center, in turn, is coupled to a communication network 28 and to a communication network 32. the communication network 28 here represents a circuit-switched network, such as a PSTN (public-switched, telephonic network). And, the communication network 32 here represents a packet-switched network, such as the Internet. A correspondent entity (CE) represents a communication device coupled to either, or both, of the communication networks 28 and 32. The correspondent entity represents a source location, or termination location, of data communicated with the mobile station 12 during operation of the communication system 10.

The base transceiver station includes transceiver circuitry, here represented by a receive part 36 and a transmit part 38. The mobile station 12 also forms a radio transceiver having radio transceiver circuitry, here represented by a receive part 42 and a transmit part 44.

Data communicated upon the forward link channels are transmitted by the transmit part 38 of the base transceiver station to the mobile station. And, the receive part 42 of the mobile station detects, and operates upon, the data communicated thereto. Data transmitted by the transmit part 44 of the mobile station upon a reverse link channel, and the receive part 36 of the base transceiver station detects, and operates upon, the data communicated by the mobile station thereto.

For the data to be communicated successfully between the mobile station and the base transceiver station, the circuitry of the respective devices must be in synchronization with one another. Typically, the mobile station becomes synchronized to the timing, and other, parameters of the fixed network infrastructure. In the exemplary IS-95/IS-2000 communication scheme pursuant to which the communication system is operable, the mobile station monitors a pilot signal generated by the base transceiver station pursuant to synchronization operations to synchronize the mobile station to the fixed network infrastructure.

The receive part 42 of the mobile station includes a delay lock loop (DLL) circuit 46 that, responsive to values of representations of the pilot signal, synchronizes the receive part 42 with the pilot signal, and, in turn, thereby, the base transceiver station. The receive part 36 of the base transceiver station is also indicated to include a DLL circuit 46. If appropriate, the receive part 36 can become synchronized with signals generated by the mobile station.

During synchronization operations, the delay lock loop circuit 46 first operates in an acquisition mode in which the initial timing is only coarsely, i.e., generally, known. When in the acquisition mode, the delay lock loop circuit attempts to align the receive part, here, for instance, the receive part 42, with the corresponding transmit part, here the transmit part 38, to which data is communicated during operation of the communication system. In the acquisition mode, the alignment attempts attempt to align the receive part with the transmit part quickly. Subsequently, the delay lock loop circuit is operated in a tracking mode, such as when the receive part is operated near the correct timing epoch. Operation of the delay lock loop circuit in the tracking mode further reduces timing error between the transmit part and the receive part.

The delay lock loop circuit of an embodiment of the present invention is reconfigurable between the acquisition and tracking modes and, also, is input-signal insensitive. The DLL circuit of an embodiment of the present invention, therefore, is more robust and behaves in a deterministic manner, irrespective of the input signal applied to the DLL circuit. Additionally, as the delay lock loop circuit 46 forms a control loop, the circuit has a loop bandwidth. The loop bandwidth is controlled, in the exemplary implementation, with a loop filter. As, here, the control loop is insensitive to the signal amplitude of input signals applied to the delay lock loop circuit, the loop filter design is simplified and the circuitry performs in a deterministic manner irrespective of the input signal level. Signal normalization of the input signal is not required as the circuit is signal-amplitude insensitive.

Figure 2:
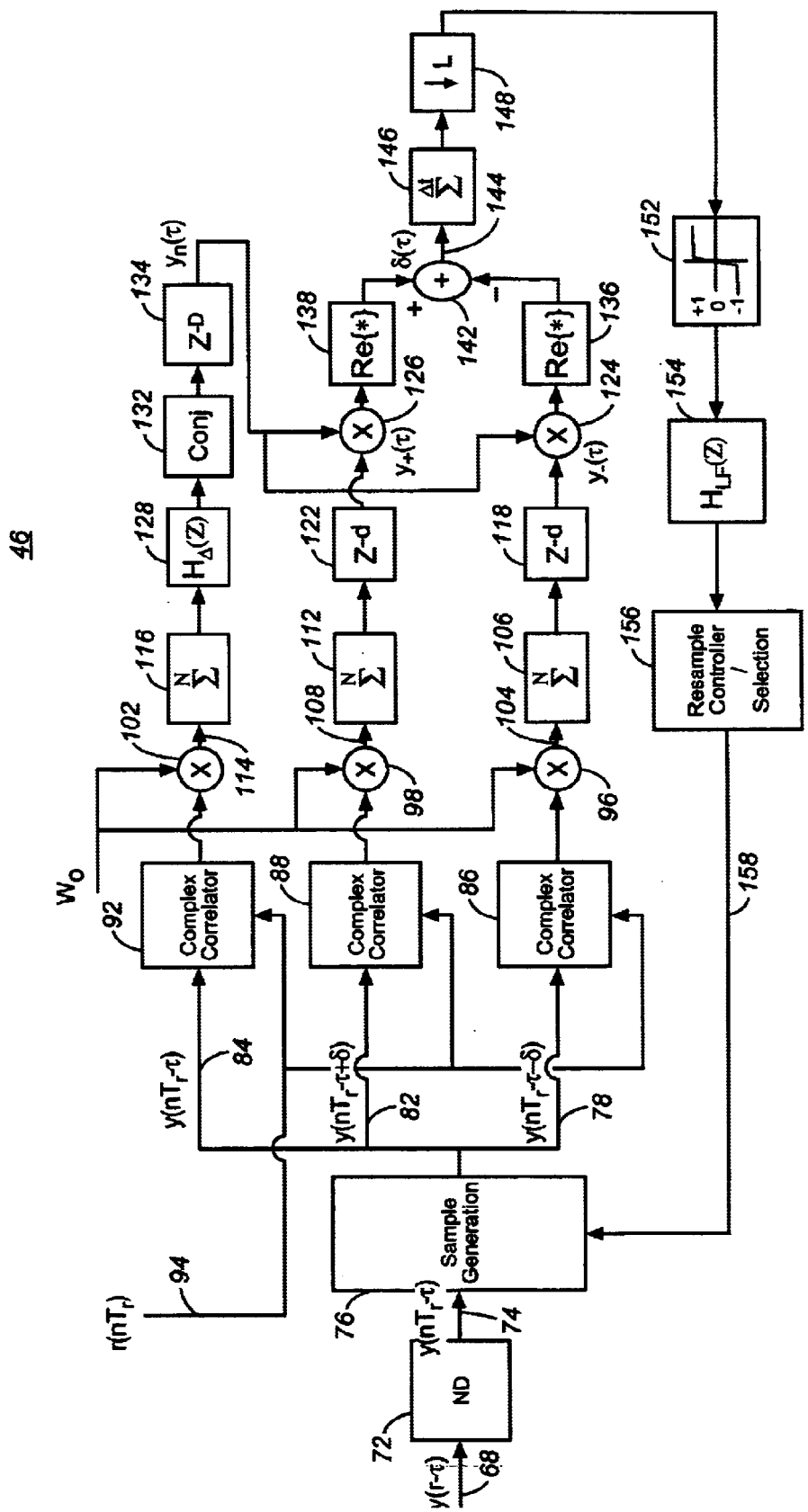
FIG. 2 illustrates a functional block diagram of a delay lock loop circuit of an embodiment of the present invention that forms a portion of a receive part of a communication station forming part of the communication system shown in FIG. 1.

FIG. 2 illustrates the delay lock loop circuit 46 of an embodiment of the present invention. Description of operation shall be described with respect to the circuit 46 embodied at the receive part 42 of the mobile station 12. Analogous operation can be described with respect to the circuit 46 embodied at the base transceiver station 18, or embodied at another receiver of another communication system.

Pilot symbols contained in a pilot signal delivered to the receive part of which the delay lock loop circuit 46 forms a portion are provided to the circuit by way of the line 68. The circuit includes an analog-to-digital (A/D) converter 72. The converter 72 converts the values provided thereto into digital form and digital representations of the values are provided, by way of the line 74, to a sample generator formed of a sample generation element 76. The sample generator generates sampled representations of the digital values applied thereto. Samples are generated on lines 78, 82, and 84. The sampled values generated on the line 84 are of zero offsets. And, the values generated on the lines 78 and 82 are of negative and positive offsets, here of corresponding magnitudes. The lines 78, 82, and 84 extend to complex correlators 86, 88, and 92, respectively. Each of the complex correlators is also coupled to receive, by way of the line 92, pseudo-noise sequences.

Values generated by the respective correlators are applied to mixer circuits 96, 98, and 102, respectively. The mixers are each also coupled to receive Walsh cover codes $W_o$. Mixed signals formed by the mixer 96 are formed on the line 104 and applied to an integrator 106. Mixed signals formed by the mixer 98 are formed on the line 108 and applied to an integrator 112. And, mixed signals formed by the mixer 102 are applied, by way of a line 114, to an integrator 116. Integrations are performed by the respective integrators over selected numbers of samples $N_L$, $N_E$, and $N_O$. The sample lengths are selectable.

The integrated values formed by the integrators 106 and 112 are provided to delay elements 118 and 122, respectively. The delay elements delay the values applied thereto by delay lengths d. Delayed, integrated values are thereafter applied, respectively, to mixers 124 and 126.

The integrated values formed by the integrator 116 of the zero-offset path is applied to a filter 128 that exhibits a filter transfer function. The filter transfer function is selectable. Filtered values are conjugated by a conjugator 132 and then delayed by a delay element 134. The delay element exhibits a delay of D. Once delayed by the delay period D, the values are also applied to the mixers 124 and 126. The mixers are separately operable to form mixed signals, of which the Real component portions thereof are passed by elements 136 and 138 and applied to a summation element 142.

The summation element forms difference values on the line 144 that are integrated by the integrator 146 over M samples. The number M is a selectable value. The integrated values are down-sampled by a down-sampler 148 and hard-limited by a sign detector 152

Hard-limited values formed by the sign detector 152 are provided to a loop filter 154 that exhibits selected filter characteristics including a filter bandwidth and is represented by a transfer function $H_{LF}(z)$.

Filtered values formed by the filter 154 are provided to a resample controller/selector 156. The controller/selector generates a control signal on the line 158 that is applied to the sample generator 76. The control signal forms a sample-selection signal. That is, values of the control signal generated on the line 158 selectably alter operation of the sample generator. The resample controller/selector performs hypothesis testing by which to derive the control signal that is generated on the line 158.

The delay lock loop circuit 46 further includes a selector 162. The selector operates to select values of selectable parameters of the delay lock loop circuit, dependent upon the mode in which the circuit is to be operated. The selector is here shown to be coupled to the integrators 106, 112, 116, and 146, to the filters 128 and 154, and to the delay elements 118, 122, and 134. Through appropriate selection by the selector of the operating parameters of such elements, the delay lock loop circuit is caused to be operated in, selectably, the acquisition or the tracking mode.

In the acquisition mode, because the phase of the pilot signal is potentially changing rapidly due to high frequency offset, the values of $N_E$, $N_O$, and $N_L$ defining the bounds of the integrations performed by the integrators 106, 112, and 116, are selected to be small. And, the value of M forming the bounds of the integration performed by the integrator 146 is selected to be large to optimize the signal-to-noise ratio of the error signal provided thereto on the line 144, prior to sign detection by the detector 152. Additionally, in the acquisition mode, the bandwidth of the filter 116 is selected to be wide enough so that filtering of the on-time pilot signal, samples of which are formed on the zero offset line 84, with high frequency content is minimized. In the exemplary implementation, the transfer function equals one, i.e., no filtering is performed by the filter 116, when the circuit is in the acquisition mode.

In the tracking mode, the filter 116 is operated to optimize the signal-to-noise ratio of the on-time pilot signal prior to the phase correction as the anticipated frequency offset is moderate, typically, compared to the offset when in the acquisition mode. The values of N forming the bounds of the integrations performed by the integrators 106, 112, and 116 are optimized, based upon design requirements.

In the acquisition mode, the filter 154 operates such that the bandwidth of the filter is wide enough to be able to track clock drift caused by potentially high frequency offset. When operated in the tracking mode, the filter 154 is operated to optimize the jitter when the delay lock loop circuit is tracking a slowly-moving finger position of the receive part of which the delay lock loop circuit forms a portion.

The values of the delays D and d are derived such that the on-time pilot signal used for phase correction is time-aligned with the early/pilot signal, given the constraint that there is no correlation between the on-time and early/late pilot signal. In the event of perfect alignment, d equals D plus delay of the filter 128. And, there is a correlation between the on-time and early symbols, ($P_O$, $P_E$) and between the on-time and late symbols ($P_O$,$P_L$). In the exemplary implementation, d equals (D-1) delay of the filter 128 when the circuit is operated in the tracking mode. In the acquisition mode, if the filter transfer function of the filter 128 equals one, then D equals zero, and d equals one. Additionally, in either of the operating modes of the delay lock loop circuit, the value of L is designed for the filter transfer function of the filter 154 to yield the optimal combination based upon the design constraints of the circuit, such as the feedback update rate or complexity.

Figure 3:
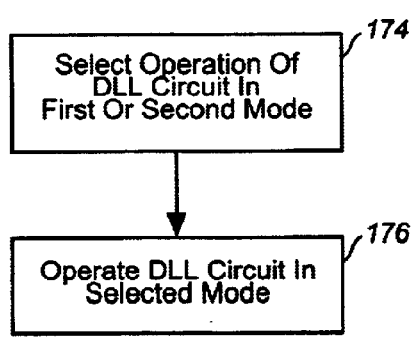
FIG. 3 illustrates a method flow diagram listing the method steps of the method of operation of an embodiment of the present invention.

FIG. 3 illustrates a method flow diagram, shown generally at 172, representative of the method of operation of an embodiment of the present invention. The method facilitates synchronization of a receiver with a receive signal transmitted thereto by controlling sample generation of sampled representations of the receive signal through operation of a delay lock loop circuit.

First, and as indicated by the block 174, operation of the delay lock loop circuit is selected alternately in a first mode and at least a second mode.

Then, and as indicated by the block 176, the delay lock loop is operated in a selected one of the first and second modes. Operation is caused responsive to values of a sample-selection signal. The sample selection signal is calculated over a selected sampling period. The sample selection signal is of a value responsive to the sampled representations of the receive signal over sample period lengths. Each sampled representation is represented in terms of a positive offset, a negative offset, and a zero offset. The selected sampling period is of first sample period lengths when the first mode is selected and the selected sampling period is of second sample period lengths when the second mode is selected.

Thereby, through operation of an embodiment of the present invention, a manner is provided by which to operate a DLL circuit alternately in an acquisition mode and a tracking mode. The delay lock loop circuit is operable irrespective of the amplitude of an input signal applied thereto. Thereby, the delay lock loop circuit is amplitude-independent, operable in a determinisitic manner, irrespective of the signal levels of input signals applied thereto.

The previous descriptions are of preferred examples for implementing the invention, and the scope of the invention should not necessarily be limited by this description. The scope of the present invention is defined by the following claims.

We claim:

1. In a receiver operable to receive a receive signal transmitted thereto during operation of a radio communication system, an improvement of a delay lock loop circuit that synchronizes the receiver with the receiver signal transmitted thereto, said delay lock loop circuit comprising:
    a sample selection signal generator adapted to receive sampled representations of the receive signal, said sample selection signal generator for generating a sample-selection signal, the sample-selection signal calculated over a selected sampling period, the sample-selection signal of a value responsive to the sampled representations of the receive signal over selected sample period lengths, each sampled representation represented in terms of a positive offset, a negative offset, and a zero offset; and
    a selector coupled to said sample selection signal generator, said selector for selecting operation of said sample selection signal generator alternately in a first mode and at least a second mode, when operation in the first mode is selected, said selector selects the selected sampling period to be of first sample period lengths, and when operation in the second mode is selected, said selector selects the selected sampling period to be of second sample period lengths.

2. The apparatus of claim 1 wherein the positive offset and the negative offset, in terms of which each sampled representation of the receive signal to which said sample selection signal generator is coupled to receive, are of substantially similar magnitudes.

3. The apparatus of claim 2 wherein said sample selection signal generator comprises a difference calculator for calculating a difference between a representation of the receive signal sample exhibiting the positive offset and the receive signal sample exhibiting the negative offset.

4. The apparatus of claim 3 wherein the representation of the receive symbol sample exhibiting the positive offset is formed of a combination of the receive signal sample exhibiting the positive offset and a conjugate of the receive signal sample that exhibits the zero-offset, and wherein the representation of the receive symbol sample exhibiting the negative offset and the conjugate of the receive signal sample that exhibits the zero offset.

5. The apparatus of claim 4 further comprising a zero-offset-path filter adapted to receive the receive signal sample that exhibits the zero offset, said zero-offset-path filter for filtering the receive signal sample applied thereto, said zero-offset-path filter exhibiting zero-offset-filter filter characteristics.

6. The apparatus of claim 5 wherein the first mode in which said selector selectably causes said sample selection signal generator to be operated comprises an acquisition mode and wherein the second mode comprises a tracking mode, the acquisition mode selected by said selector prior to selection by said selector of the tracking mode.

7. The apparatus of claim 6 wherein the zero-offset-filter filter characteristics exhibited by said zero-offset-path filter are of selectable characteristics and wherein said selector further selects the zero-offset-filter filter characteristics.

8. The apparatus of claim 6 wherein the zero-offset-filter filter characteristics exhibited by said zero-offset-path filter comprise a filter bandwidth, wherein said selector selects the filter bandwidth of said zero-offset filter such that, when said sample selection signal generator is selected to be operated in the tracking mode, the filter bandwidth of said zero-offset path filter is selected to be of a first bandwidth and, when said sample selection signal generator is selected to be operated in the acquisition mode, the filter bandwidth is selected to be of a second bandwidth, the second bandwidth larger than the first bandwidth.

9. The apparatus of claim 3 further comprising a selection-path filter adapted to receive values representative of the difference calculated by said difference calculator, said selection-path-filter for filtering the values applied thereto, said selection-path-filter exhibiting selection-path-filter filter characteristics.

10. The apparatus of claim 9 wherein the selection-path-filter filter characteristics exhibited by said selection-path filter are of selectable characteristics and wherein said selector further selects the selection-path-filter filter characteristics.

11. The apparatus of claim 9 further comprising a sign detector coupled to said difference calculator, said sign detector for forming sign-detected values indicative at least whether the values of the difference calculated by said difference calculator are of positive or negative values, the values representative of the difference to which said selection-path filter is adapted to receive formed of the sign-detected values.

12. The apparatus of claim 6 further comprising an integrator coupled to said difference calculator, said integrator for integrating the difference formed by said difference calculator over a selected period.

13. The apparatus of claim 12 wherein said selector further selects the selected period over which said integrator integrates the difference.

14. The apparatus of claim 13 wherein said selector selects the selected period such that, when said sample selection signal generator is selected to be operated in the re-tracking mode, the selected period is of a first period length and, when said sample selection signal generator is selected to be operated in the acquisition mode, the selected period is of a second period length, the second period length greater than the first period length.

15. In a method for receiving a receiver signal transmitted to a receiver during operation of a spread-spectrum communication system, an improvement of a method for facilitating synchronization of the receiver with the receive signal transmitted thereto by controlling sample generation of sampled representations of the receive signal by way of a delay lock loop, said method comprising:
    selecting operation of the Delay Lock Loop (DLL) alternately in a first mode and at least a second mode; and
    operating the Delay Lock Loop in a selected one of the first mode and the at least the second mode pursuant to which a sample-selection signal is generated, the sample-selection signal calculated over a selected sampling period, the sample-selection signal of a value responsive to the sampled representation of the receive signal over sample period lengths, each sampled representation represented in terms of a positive offset, a negative offset, and a zero offset, the selected sampling period of first sample period lengths when the first mode is selected and the selected sampling period of second sample period lengths when the second mode is selected.

16. The method of claim 15 wherein said operation of operating the Delay Lock Loop further comprises the operation of filtering the sampled representation that exhibits the zero offset at a zero-offset-path filter, the zero-offset-path filter exhibiting zero-offset-filter filter characteristics.

17. The method of claim 16 wherein the zero-offset-filter filter characteristics comprise a filter bandwidth, and wherein, when the delay lock loop is selected to be operated in the first mode, the filter bandwidth is of a first bandwidth and wherein, when the delay lock loop is selected to be operated in the second mode, the filter bandwidth is of a second bandwidth, the first bandwidth larger than the second bandwidth.

18. The method of claim 17 wherein generation of the sample-selection signal pursuant to operation of the delay lock loop during said operation of operating comprises calculating a difference between a representation of the receive signal sample exhibiting the positive offset and the receive signal sample exhibiting the negative offset characteristics.

19. The method of claim 18 wherein said operation of operating further comprises integrating the difference over a selected period.

20. The method of claim 19 wherein, when the delay lock loop is selected to be operated in the first mode, the selected period is of a first period length, and wherein, when the delay lock loop is selected to be operated in the second mode, the selected period is of a second period length.

* * * * *